United States Patent
Kato et al.

(10) Patent No.: US 8,624,263 B2
(45) Date of Patent: Jan. 7, 2014

(54) DIAMOND SEMICONDUCTOR DEVICE AND METHOD OF MANUFACTURING THE SAME

(75) Inventors: Hiromitsu Kato, Tsukuba (JP); Toshiharu Makino, Tsukuba (JP); Masahiko Ogura, Tsukuba (JP); Hideyo Okushi, Tsukuba (JP); Satoshi Yamasaki, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 389 days.

(21) Appl. No.: 12/988,089

(22) PCT Filed: Mar. 6, 2009

(86) PCT No.: PCT/JP2009/054264
§ 371 (c)(1),
(2), (4) Date: Oct. 15, 2010

(87) PCT Pub. No.: WO2009/128301
PCT Pub. Date: Oct. 22, 2009

(65) Prior Publication Data
US 2011/0037076 A1 Feb. 17, 2011

(30) Foreign Application Priority Data
Apr. 17, 2008 (JP) .................... 2008-108365

(51) Int. Cl.
*H01L 29/16* (2006.01)
*H01L 21/02* (2006.01)

(52) U.S. Cl.
USPC ........................................ 257/77; 438/105

(58) Field of Classification Search
USPC .......................... 257/77, E21.005; 438/105
See application file for complete search history.

(56) References Cited

U.S. PATENT DOCUMENTS

| | | | | |
|---|---|---|---|---|
| 5,961,717 A | * | 10/1999 | Kamo et al. | 117/92 |
| 2005/0202665 A1 | * | 9/2005 | Namba et al. | 438/607 |
| 2007/0111498 A1 | * | 5/2007 | Nambo et al. | 438/607 |
| 2008/0193366 A1 | * | 8/2008 | Kato et al. | 423/446 |

FOREIGN PATENT DOCUMENTS

| | | |
|---|---|---|
| JP | 10-81587 A | 3/1998 |
| JP | 2005-335988 A | 12/2005 |
| JP | 2006-240983 A | 9/2006 |
| WO | WO 03/106743 A1 | 12/2003 |

\* cited by examiner

*Primary Examiner* — Long K Tran
*Assistant Examiner* — Jordan Klein
(74) *Attorney, Agent, or Firm* — Birch, Stewart, Kolasch & Birch, LLP (57) ABSTRACT

The present invention is contemplated for providing a diamond semiconductor device where an impurity-doped diamond semiconductor is buried in a selected area, and a method of manufacturing the same. That is, a diamond semiconductor device having an impurity-doped diamond area selectively buried in a recessed portion formed in a diamond substrate; and a method of manufacturing a diamond semiconductor device, including the steps of selectively forming an recessed portion on the {100}-facet diamond semiconductor substrate, wherein the bottom face of the recessed portion is surrounded by the {100} facet and the side face of the recessed portion is surrounded by the {110} facet, and forming an impurity-doped diamond area by epitaxially growing diamond in the <111> direction while doping with impurities and burying the recessed portion.

5 Claims, 10 Drawing Sheets

DIAMOND SEMICONDUCTOR DEVICE AND METHOD OF MANUFACTURING THE SAME

TECHNICAL FIELD

The present invention relates to a diamond semiconductor device and a method of manufacturing the same.

BACKGROUND ART

Diamond has a wide band gap, the highest thermal conductivity among materials, and a high chemical stability. Therefore, applications of diamond to semiconductor devices have been studied. A semiconductor device using diamond stably operates in a high temperature environment and in a space environment and can withstand a high-speed, high-power operation. Therefore, a demand thereof is high. In addition, high-performance electronic devices such as deep UV-emitting devices and electron emission sources utilizing unique features of diamond, which cannot be constructed by using other materials, can be manufactured.

In order to use the diamond as a material for a semiconductor device, it is necessary to control p-type or n-type electric conduction. A p-type diamond semiconductor exists in nature, and it is relatively easy to artificially synthesize the p-type diamond semiconductor. For example, if a compound containing boron is introduced as a source of impurities into a chamber when performing chemical vapor deposition (CVD) with diamond, the p-type diamond semiconductor can be obtained.

On the other hand, an n-type diamond semiconductor does not exist in nature, and until now, it has been believed that it is impossible to artificially synthesize the n-type diamond semiconductor. In 1997, the n-type diamond semiconductor was obtained by epitaxially growing diamond while doping a {111}-facet diamond single crystal substrate with phosphorus as an n-type impurity (refer to Patent Literature 1). However, at that time, when the diamond is epitaxially grown while doping a {100}-facet diamond single crystal substrate with n-type impurities in such synthesis conditions as disclosed in Patent Document 1, there are problems in that doping efficiency is very low, the n-type impurities are not almost accepted, and a conductive property is not nearly obtained.

The {111}-facet diamond single crystal substrate has problems in that it can not be obtained in a large area with high quality by a high-temperature and high-pressure method, and by a chemical vapor deposition method, and it is difficult to lower the cost. On the other hand, the {100}-facet diamond single crystal substrate is relatively easily realized in a large area with high quality. Therefore, in developing electronic devices, a technique of growing the n-type diamond semiconductor on the {100} facet has become essential.

In recent years, two techniques of growing an n-type diamond semiconductor on the {100}-facet diamond single crystal substrate have been proposed.

(1) A method of growing an n-type diamond semiconductor on the {111} facet, which is formed on the {100} facet, by processing the {100} facet and growing the {111} facet on the {100} facet under control of a parameter upon the diamond growing (refer to Patent Literature 2).

(2) A method of epitaxially growing diamond while directly doping the {100}-facet diamond single crystal substrate with n-type impurities under in synthesis conditions different from those of Patent Document 1 (refer to Patent Literature 3).

In these methods, basically, p-type and n-type diamond semiconductors can be grown without limitation of the facet orientation of the substrate. Currently, research and development of pn junction type and pin junction type semiconductor devices have been made based on the aforementioned techniques.

In general semiconductor synthesizing technology, a technique of burying semiconductors in specific positions and a technique of selectively growing semiconductors are very important. The other semiconductor materials representatively including silicon can be used to synthesize p-type and n-type semiconductors with use of an ion implantation method, and a selectively buried semiconductor area can be formed by an ion implantation method. On the other hand, with respect to the diamond semiconductor, for the reason that defects occurring from the ion implantation cannot be easily recovered by thermal treatment and the implanted impurities are not accepted at substitution positions, it is believed that it is substantially impossible to produce the above-mentioned buried semiconductor area.

[Patent Literature 1] JP-A-10-81587 ("JP-A" means unexamined published Japanese patent application)
[Patent Literature 2] WO 2003/106743
[Patent Literature 3] JP-A-2006-240983

DISCLOSURE OF INVENTION

Problems to be Solved by the Invention

The present invention was achieved for solving the problems. The present invention is contemplated for providing a diamond semiconductor device where an impurity-doped diamond semiconductor is buried in a selected area, and a method for manufacturing the same.

Means for Solving the Problems

The problems are solved by the following means.

<1> A diamond semiconductor device having an impurity-doped diamond area selectively buried in a recessed portion formed in a diamond substrate.

<2> The diamond semiconductor device according to <1>, wherein the diamond substrate is an impurity-doped diamond substrate.

<3> The diamond semiconductor device according to <1>, wherein the diamond substrate is a diamond substrate on which a diamond film is formed.

<4> The diamond semiconductor device according to <1>, <2>, or <3>, wherein a principal surface of the diamond substrate is a {100} facet, a side face of the recessed portion is a {110} facet, and a bottom face of the recessed portion is a {100} facet.

<5> A method for manufacturing a diamond semiconductor device, comprising the steps of:

selectively forming a recessed portion on a {100}-facet diamond semiconductor substrate, wherein a bottom face of the recessed portion is surrounded by a {100} facet, and a side face of the recessed portion is surrounded by a {110} facet; and forming an impurity-doped diamond area by epitaxially growing a diamond in a <111> direction while doping with impurities to thereby bury the recessed portion.

<6> The method of manufacturing a diamond semiconductor device according to <5>, wherein the impurity is phosphorus.

Effects of the Invention

The technique of forming a buried semiconductor area and the selective growing technique are essential techniques for manufacturing a semiconductor device. Application fields of the semiconductor device substantially differ by the presence or absence of these techniques.

According to the diamond semiconductor device and the manufacturing method thereof of the present invention, it is possible to bury an impurity-doped diamond semiconductor in a selected area.

For example, in the development of the device, since the contact resistance in the junction of metal and semiconductor directly influences the performance of the device, a decrease in the resistance is required.

Particularly, in the n-type diamond semiconductor on the {100} facet, since high concentrated doping (phosphorus concentration: $10^{20}$ cm$^{-3}$ or more) cannot be achieved by the conventional technique, the decrease in the contact resistance cannot be obtained. However, in the diamond semiconductor device and the manufacturing method thereof according to the present invention, the decrease in the contact resistance can be achieved.

DESCRIPTION OF THE PREFERRED EMBODIMENTS

Figure 1:
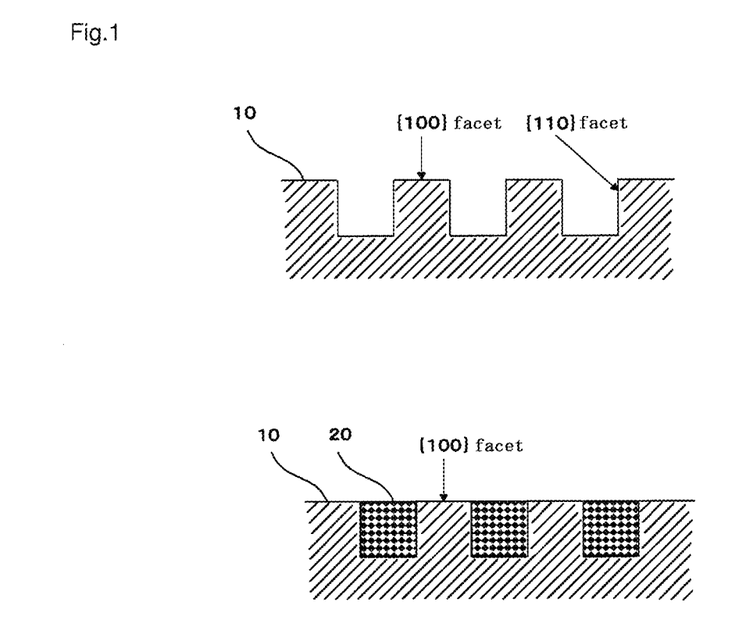
[FIG. 1] Illustrative drawing of the present invention.

FIG. 1 shows an illustrative drawing of the present invention.

The present invention is a diamond semiconductor device having an impurity-doped diamond area 20 buried in a recessed portion selectively formed in a diamond substrate 10, and a method for manufacturing thereof.

In the preferred embodiment of the present invention, a diamond {100}-facet single crystal substrate 10 is processed and a diamond semiconductor is grown from the bottom corners of a processed recessed portion in the <111> direction, and impurity doping is simultaneously performed, so that a buried impurity-doped diamond area 20 is formed.

The diamond substrate 10 is any one of non-doped, boron doped, phosphorus-doped or nitrogen-doped p-type or n-type {100}-facet substrate, or {100}-facet grown film. A buried impurity-doped diamond area 20 contains V-group elements representatively including phosphorus and other impurity elements which constitute an n-type diamond semiconductor, or III-group elements representatively including boron and other impurity elements which constitute a p-type diamond semiconductor.

The method of manufacturing a diamond semiconductor device of the present invention, including the steps of forming an recessed portion on the area desired to form a buried area on the {100}-facet diamond semiconductor substrate, wherein the bottom face and the side face of the recessed portion are surrounded by the {100} facet and the {110} facet, respectively, and forming an impurity-doped diamond area by epitaxially growing diamond in the <111> direction while doping with impurities thereby burying the processed recessed portion. Herein, when the growing is performed in the <111> direction on the {100}-facet substrate, the corner of the {100} facet and {110} facet serves as the start point of the growing.

Exemplary doped impurities are phosphorus atoms in this embodiment. The capture efficiency greatly depends on the facet orientation of the substrate. In the {111}-facet growing (the growing in the <111> direction) using the {111}-facet substrate, phosphorus capture efficiency is about 0.02%. In contrast, in the {100}-facet growing (the growing in the <100> direction) using the {100}-facet substrate, phosphorus capture efficiency is less than 0.00001%. The buried n-type semiconductor area can be selectively formed on the {100} facet by using the large difference in the capture efficiency according to the growing direction.

The phosphorus capture efficiency is calculated by using the following equation.

(Phosphorus capture efficiency)=(concentration of phosphorus atoms with respect to concentration of carbon atoms in diamond($[P]/[C]$))/(concentration of phosphine with respect to concentration of methane in vapor($[PH_3]/[CH_4]$))

Figure 2:
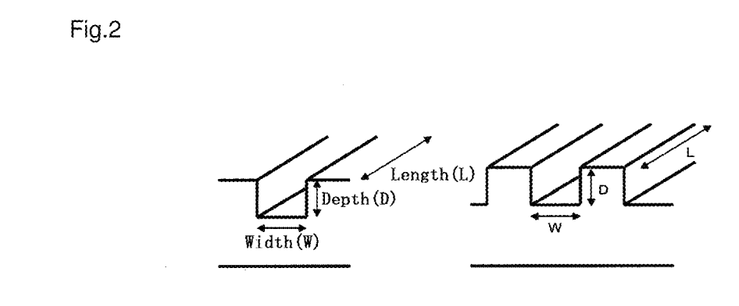
[FIG. 2] Recessed portion according to the present invention.

In the preferred embodiment of the present invention, by processing the {100}-facet diamond single crystal substrate, a recessed portion having the side face of {110} and the bottom face of {100} is formed. It is preferable that the relationship among the depth D, the width W, and the length L of the recessed portion be 0.7 W<D<1.4 W and W<L<∞ (the size of substrate) (refer to FIG. 2). The {100} facet of the bottom face and the {110} facet of the side face may be deviated from ideal faces by about 0 to 10°. There is no need to form the recessed portions periodically. In addition, the recessed portion produced by periodic rectangular protrusions may be used. It is preferable that the recessed portion is formed only in a region where the buried n-type diamond area is needed.

In addition, if there is no need to bury the entire recessed portion, conditions different from the aforementioned conditions may be set.

The impurity-doped diamond semiconductor according to the present invention is characterized in that it is selectively buried only in the recessed portion formed on the {100}-facet diamond single crystal substrate. In the case of phosphorus doping, since the epitaxial growth is performed in the <111> direction, the phosphorus capture efficiency is relatively high; and the concentration of phosphorus can be controlled in a wide range of from $10^{16}$ cm$^{-3}$ to $10^{20}$ cm$^{-3}$ level. In addition, since the buried impurity-doped diamond semiconductor substrate is formed on the {100}-facet oriented substrate, which is essential for development of devices, it is highly practical.

The {100}-facet diamond single crystal substrate to be processed may be any one of a {100}-facet substrate formed by a high-temperature and high-pressure method, a substrate formed by a chemical vapor deposition (CVD) method, and a grown film. In addition, it may be a grown film on an impurity-doped conductive substrate.

In addition, the aforementioned buried impurity-doped diamond area can be easily identified by cleaving an appropriate area and performing in-plane distribution measurement using SIMS measurement, cathode luminance measurement, or the like. Since the recessed portion has a characterized structure at the formation time, it is easy to identify the area.

Hereinafter, Examples 1 to 6 are described in detail with reference to FIGS. 3 to 28.

In FIGS. 3 to 28, each of left-handed views is a plan view of a diamond semiconductor device, and each of right-handed views is a cross-sectional view thereof.

Example 1

Figure 3:
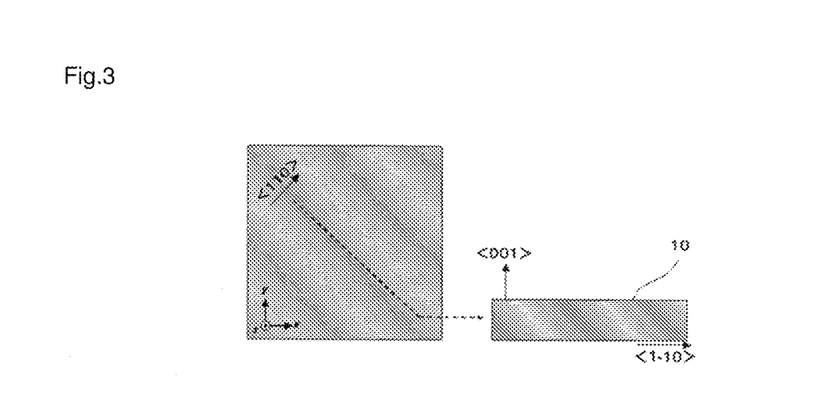
[FIG. 3] Illustrative drawing of the process of Example 1.
Figure 4:
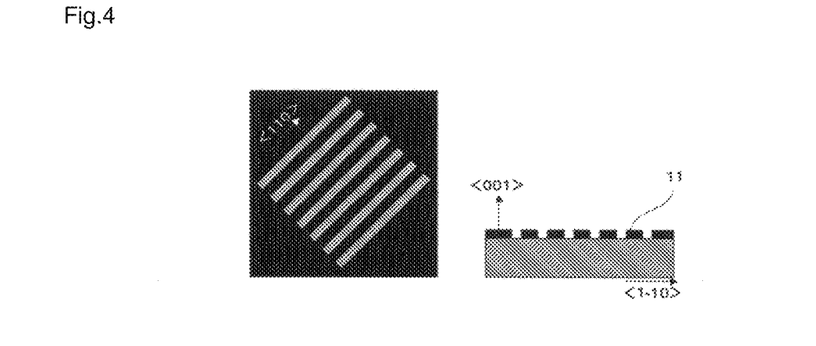
[FIG. 4] Illustrative drawing of the process of Example 1.
Figure 5:
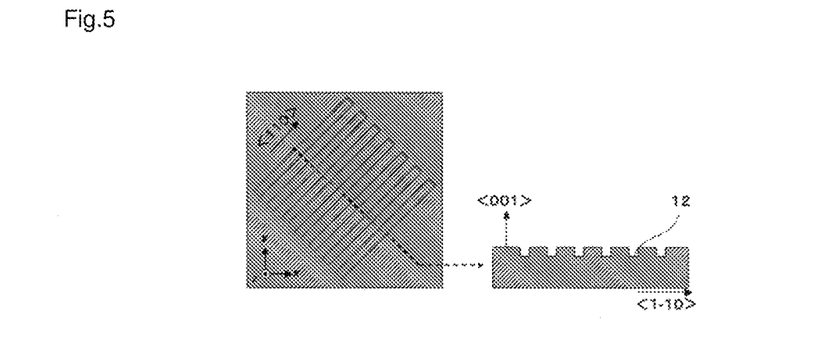
[FIG. 5] Illustrative drawing of the process of Example 1.

As illustrated in FIG. 3, a diamond single crystal substrate 10 having {100} facet as the surface thereof was prepared. As illustrated in FIG. 4, an Au/Ti thin film mask (Au 300 nm/Ti 10 nm) 11 having lines & spaces in the <110> direction, width of which was 1 μm and an interval of which was 1 μm, were formed on a portion of the surface of the {100}-facet diamond single crystal substrate by using photolithography.

The {100}-facet diamond single crystal substrate which was patterned with an Au/Ti thin film mask illustrated in FIG. 4 was etched by using an inductively coupled plasma etching apparatus. The conditions of the etching gas were $O_2$: 95 sccm, $CF_4$: 2 sccm, RF power: 300 W, bias: 50 W, and pressure: 2 Pa, and the etching depth was 1 μm. In this case, the etching selection ratio of the {100}-facet diamond single crystal substrate and Au was about 1:8. Next, a thermal aqua regia process ($HNO_3$:$HCl$=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 5, a recessed portion 12 which was a trench having a rectangular cross section and extending in one direction was formed on a surface layer of the {100}-facet diamond single crystal substrate. The side face of the recessed portion 12 was covered with the {110} facet, the bottom face of the recessed portion was covered with the {100} facet.

Figure 6:
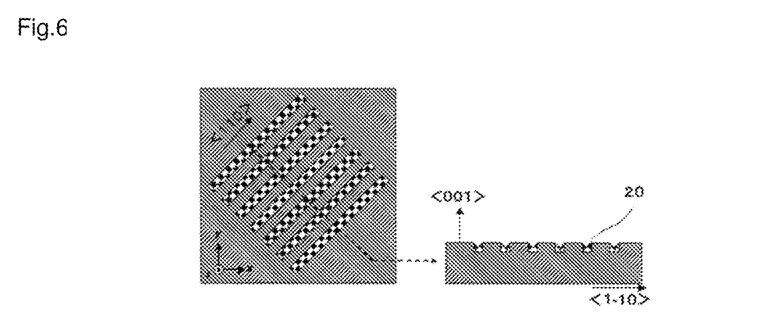
[FIG. 6] Illustrative drawing of the process of Example 1.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: 9.75×10³ Pa, microwave power: 750 W, temperature of substrate heater: 800° C., and growing time: 2 hours. Accordingly, the phosphorus-doped diamond area 20 was formed to be buried in the recessed portion 12. At this time, the phosphorus-doped diamond was grown in the <111> direction from the bottom stage (the corner of the {110} facet and the {100} facet) of the recessed portion as the start point.

With respect to the {100}-facet diamond single crystal substrate including the selectively buried area 20 illustrated in FIG. 6, the phosphorus concentration was measured by using SIMS (Secondary ion Mass Spectroscopy). As a result, phosphorus atoms were selectively captured only into the area of the recessed portions, so that the concentration of phosphorus atoms was 1×10²⁰ cm⁻³.

In order to measure the characteristics of the electric conductivity of the n-type diamond area 20 buried in the recessed portion, electrodes of Ti (30 nm)/Pt (30 nm)/Au (100 nm) were vapor-deposited in an interval of 10 μm. Form the current-voltage characteristics between two electrodes, the electric conductivity was clearly obtained. The value of resistivity was about 2×10³ Ωcm.

Example 2

Figure 7:
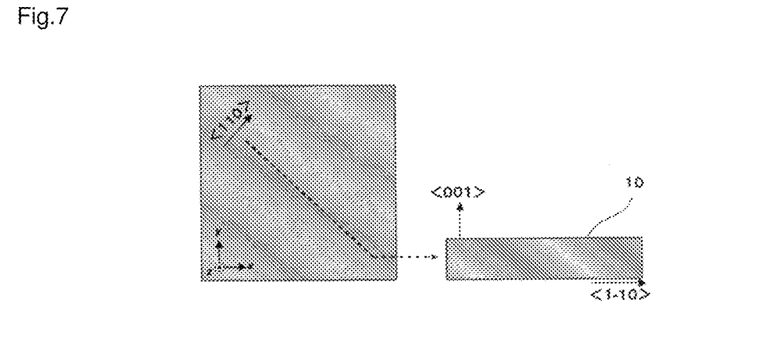
[FIG. 7] Illustrative drawing of the process of Example 2.
Figure 8:
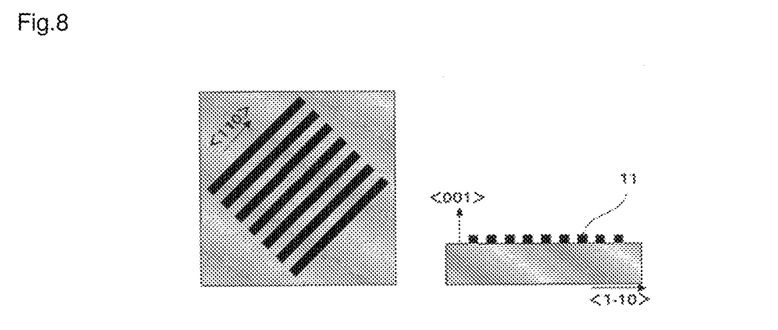
[FIG. 8] Illustrative drawing of the process of Example 2.
Figure 9:
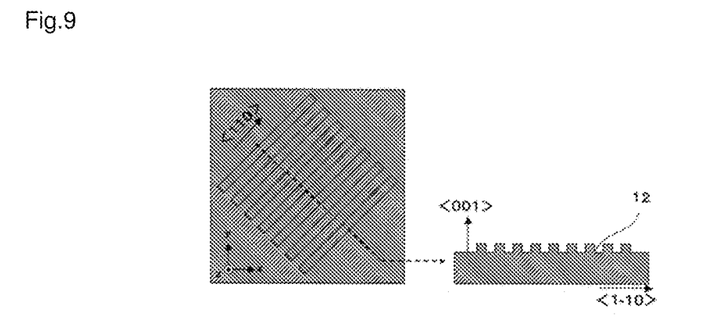
[FIG. 9] Illustrative drawing of the process of Example 2.

As illustrated in FIG. 7, a diamond single crystal substrate 10 having {100} facet as the surface thereof was prepared. As illustrated in FIG. 8, an Au/Ti thin film mask (Au 300 nm/Ti 10 nm) 11 having lines & spaces in the <110> direction, width of which was 1 μm and an interval of which was 1 μm, were formed on a portion of the surface of the {100}-facet diamond single crystal substrate by using photolithography.

The {100}-facet diamond single crystal substrate which was patterned with an Au/Ti thin film mask illustrated in FIG. 8 was etched by using an inductively coupled plasma etching apparatus. The conditions of the etching gas were $O_2$: 95 sccm, $CF_4$: 2 sccm, RF power: 300 W, bias: 50 W, and pressure: 2 Pa, and the etching depth was 1 μm. In this case, the etching selection ratio of the {100}-facet diamond single crystal substrate and Au was about 1:8. Next, a thermal aqua regia process ($HNO_3$:$HCl$=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 9, a recessed portion 12 which was sandwiched by rectangular gibbosities and had a rectangular cross section, and was extending in one direction was formed on a surface layer of the {100}-facet diamond single crystal substrate. The side face of the recessed portion 12 was covered with the {110} facet, the bottom face of the recessed portion was covered with the {100} facet.

Figure 10:
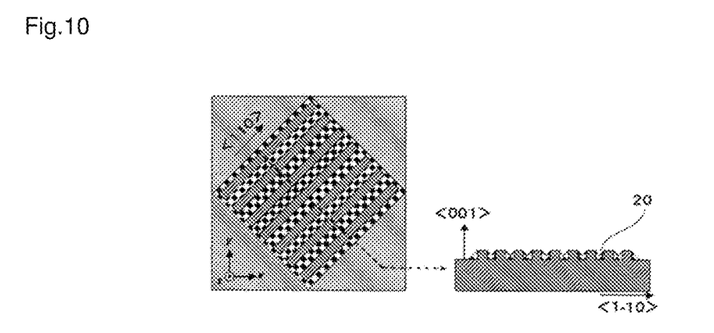
[FIG. 10] Illustrative drawing of the process of Example 2.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: 9.75×10³ Pa, microwave power: 750 W, temperature of substrate heater: 800° C., and growing time: 2 hours. Accordingly, the phosphorus-doped diamond area 20 was formed to be buried in the recessed portion 12. At this time, the phosphorus-doped diamond was grown in the <111> direction from the bottom stage (the corner of the {110} facet and the {100} facet) of the recessed portion 12 as the start point.

With respect to the {100}-facet diamond single crystal substrate including the selectively buried area 20 illustrated in FIG. 10, the phosphorus concentration was measured by using SIMS (Secondary Ion Mass Spectroscopy). As a result, phosphorus atoms were selectively captured only into the area of the recessed portions, so that the concentration of phosphorus atoms was 1×10²⁰ cm³.

In order to measure the characteristics of the electric conductivity of the n-type diamond area 20 buried in the recessed portion, electrodes of Ti (30 nm)/Pt (30 nm)/Au (100 nm) were vapor-deposited in an interval of 10 μm. Form the current-voltage characteristics between two electrodes, the electric conductivity was clearly obtained. The value of resistivity was about 2×10³ Ωcm.

Example 3

Figure 11:
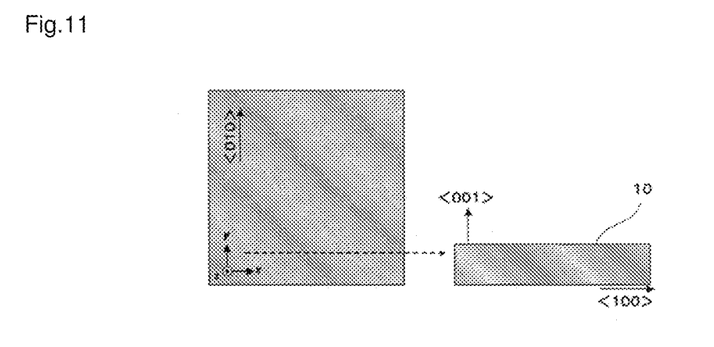
[FIG. 11] Illustrative drawing of the process of Example 3.
Figure 12:
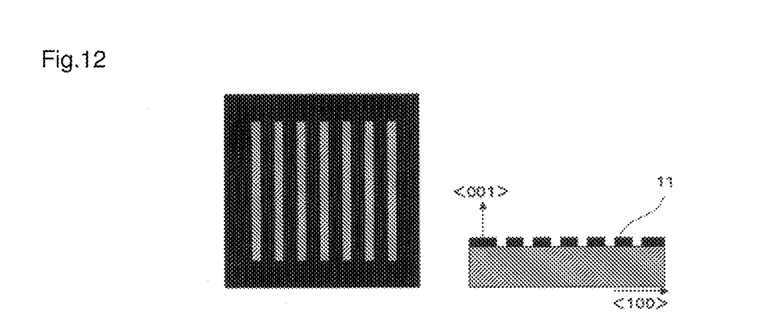
[FIG. 12] Illustrative drawing of the process of Example 3.
Figure 13:
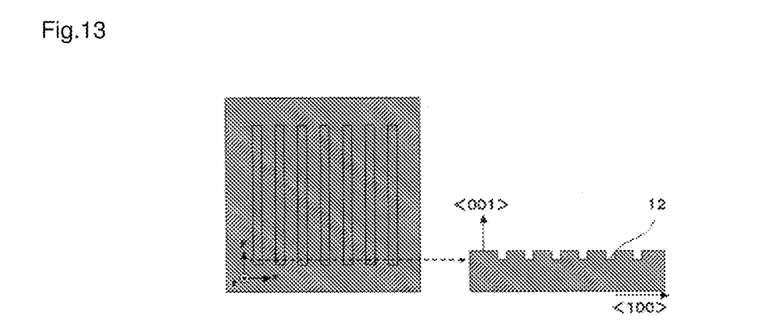
[FIG. 13] Illustrative drawing of the process of Example 3.

As illustrated in FIG. 11, a diamond single crystal substrate 10 having {100} facet as the surface thereof was prepared. As illustrated in FIG. 12, an Au/Ti thin film mask (Au 300 nm/Ti 10 nm) 11 having lines & spaces in the <100> direction, width of which was 1 μm and an interval of which was 1 μm, were formed on a portion of the surface of the {100}-facet diamond single crystal substrate by using photolithography.

The {100}-facet diamond single crystal substrate which was patterned with an Au/Ti thin film mask illustrated in FIG. 12 was etched by using an inductively coupled plasma etching apparatus. The conditions of the etching gas were $O_2$: 95 sccm, $CF_4$: 2 sccm, RF power: 300 W, bias: 50 W, and pressure: 2 Pa, and the etching depth was 1 μm. In this case, the etching selection ratio of the {100}-facet diamond single crystal substrate and Au was about 1:8. Next, a thermal aqua regia process ($HNO_3$:$HCl$=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 13, a recessed portion 12 which was a trench having a rectangular cross section and extending in one direction was formed on a surface layer of the {100}-facet diamond single crystal substrate. The side face of the recessed portion 12 was covered with the {100} facet, and the bottom face of the recessed portion was also covered with the {100} facet.

Figure 14:
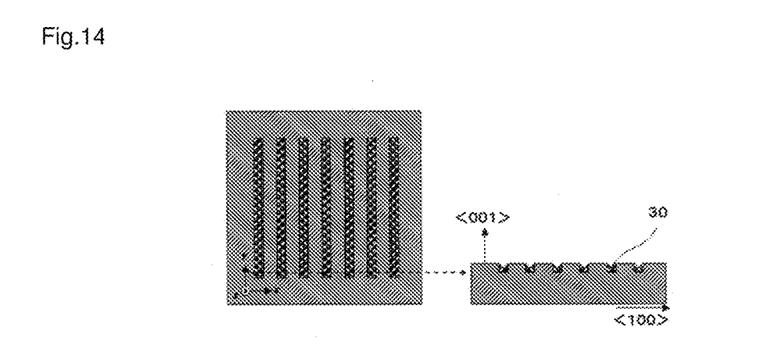
[FIG. 14] Illustrative drawing of the process of Example 3.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: $9.75 \times 10^3$ Pa, microwave power: 750 W, temperature of substrate heater: 800° C., and growing time: 2 hours. Accordingly, the phosphorus-doped diamond area 30 was formed to be buried in the recessed portion 12. At this time, the phosphorus-doped diamond was grown in the <110> direction from the bottom stage (the corner of the {100} facet and the {100} facet) of the recessed portion as the start point.

With respect to the {100}-facet diamond single crystal substrate including the selectively buried area 30 illustrated in FIG. 14, the phosphorus concentration was measured by using SIMS (Secondary Ion Mass Spectroscopy). As a result, phosphorus atoms were selectively captured only into the area of the recessed portions 12, so that the concentration of phosphorus atoms was $5 \times 10^{17}$ cm$^{-3}$.

Example 4

Figure 15:
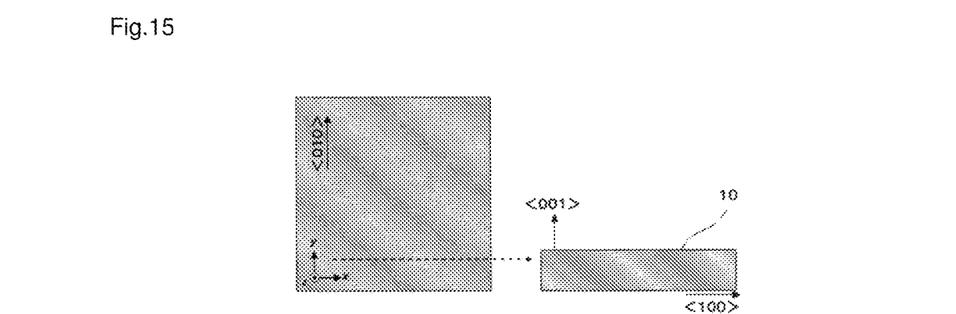
[FIG. 15] Illustrative drawing of the process of Example 4.
Figure 16:
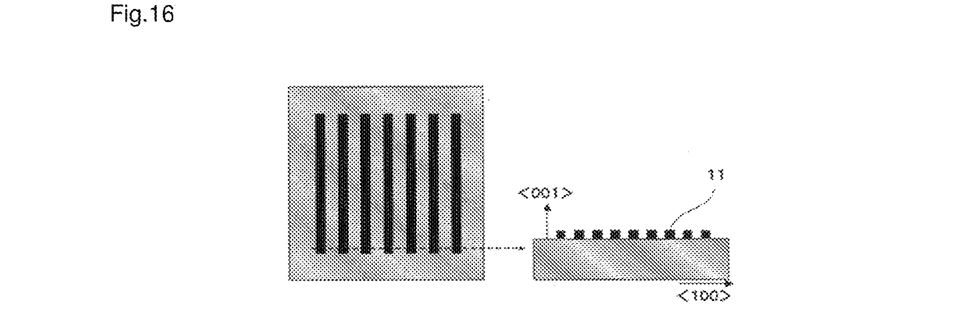
[FIG. 16] Illustrative drawing of the process of Example 4.
Figure 17:
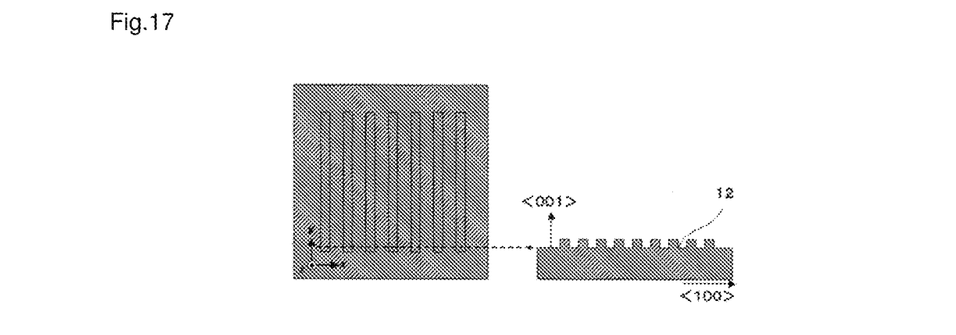
[FIG. 17] Illustrative drawing of the process of Example 4.

As illustrated in FIG. 15, a diamond single crystal substrate 10 having {100} facet as the surface thereof was prepared. As illustrated in FIG. 16, an Au/Ti thin film mask (Au 300 nm/Ti 10 nm) 11 having lines & spaces in the <100> direction, width of which was 1 μm and an interval of which was 1 μm, were formed on a portion of the surface of the {100}-facet diamond single crystal substrate by using photolithography.

The {100}-facet diamond single crystal substrate which was patterned with an Au/Ti thin film mask illustrated in FIG. 16 was etched by using an inductively coupled plasma etching apparatus. The conditions of the etching gas are $O_2$: 95 sccm, $CF_4$: 2 sccm, RF power: 300 W, bias: 50 W, and pressure: 2 Pa, and the etching depth was 1 μm. In this case, the etching selection ratio of the {100}-facet diamond single crystal substrate and Au was about 1:8. Next, a thermal aqua regia process ($HNO_3$:$HCl$=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 17, a recessed portion 12 which was sandwiched by rectangular gibbosities and has a rectangular cross section, and was extending in one direction was formed on a surface layer of the {100}-facet diamond single crystal substrate. The side face of the recessed portion 12 was covered with the {100} facet, and the bottom face of the recessed portion was also covered with the {100} facet.

Figure 18:
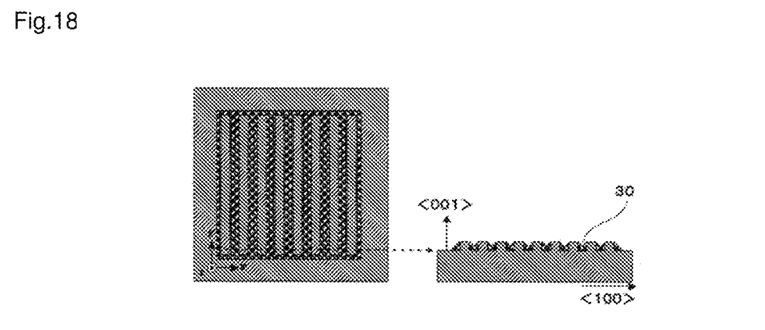
[FIG. 18] Illustrative drawing of the process of Example 4.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: $9.75 \times 10^3$ Pa, microwave power: 750 W, temperature of substrate heater: 800° C., and growing time: 2 hours. Accordingly, the phosphorus-doped diamond area 30 was formed to be buried in the recessed portion 12. At this time, the phosphorus-doped diamond was grown in the <110> direction from the bottom stage (the corner of the {100} facet and the {100} facet) of the recessed portion as the start point.

With respect to the {100}-facet diamond single crystal substrate including the selectively buried area 30 illustrated in FIG. 18, the phosphorus concentration was measured by using SIMS (Secondary Ion Mass Spectroscopy). As a result, phosphorus atoms were selectively captured only into the area of the recessed portions, so that the concentration of phosphorus atoms was $5 \times 10^{17}$ cm$^{-3}$.

Example 5

Figure 19:
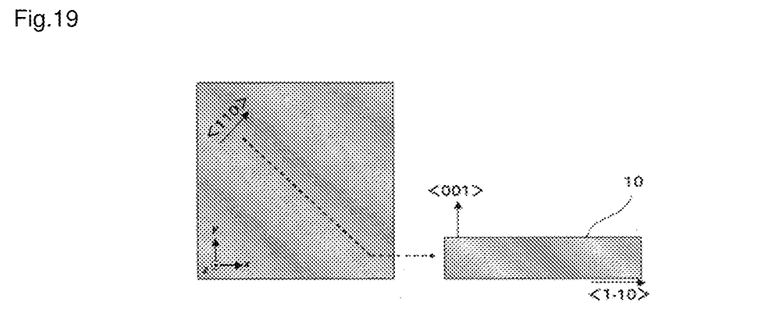
[FIG. 19] Illustrative drawing of the process of Example 5.

As illustrated in FIG. 19, a diamond single crystal substrate 10 having {100} facet as the surface thereof was prepared. The synthesis of the phosphorus-doped diamond was performed by using a microwave plasma CVD apparatus under the conditions of $H_2$: 397 sccm, $CH_4$: 1.6 sccm, $PH_3$: 0.16 sccm, pressure: $3.25 \times 10^3$ Pa, microwave power: 750 W, temperature of substrate heater: 900° C., and growing time: 6 hours.

Figure 20:
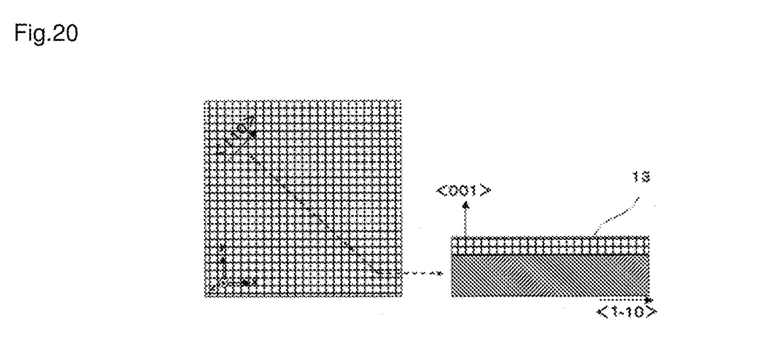
[FIG. 20] Illustrative drawing of the process of Example 5.

As illustrated in FIG. 20, a phosphorus-doped n-type diamond semiconductor 13 having a film thickness of about 2 μm was formed. From the Hall effect measurement, n-type determination was stably obtained in a temperature range of from the room temperature to about 700° C. From the slope of temperature dependency, the activation energy of phosphorus donor was estimated to be 570 meV. Thus, it can be confirmed that the phosphorus-doped n-type diamond semiconductor was formed on the {100}-facet diamond single crystal substrate.

Figure 21:
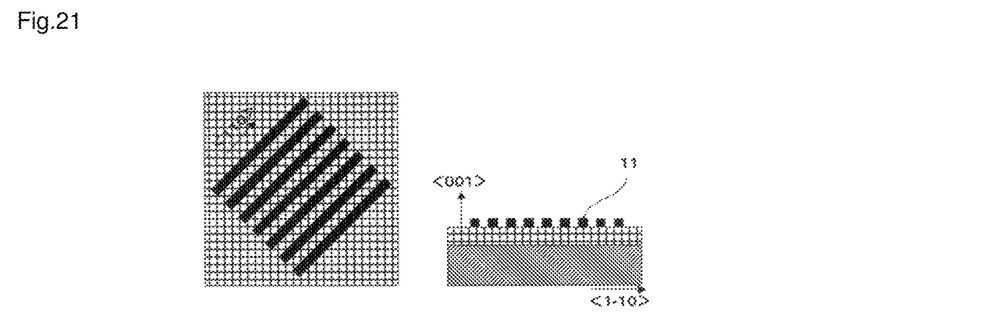
[FIG. 21] Illustrative drawing of the process of Example 5.
Figure 22:
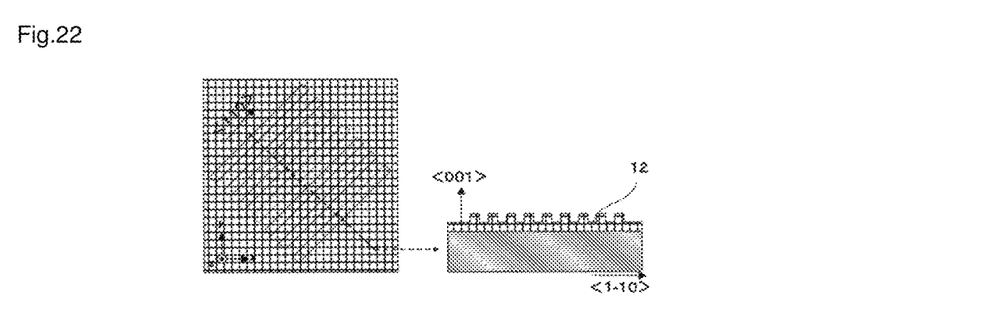
[FIG. 22] Illustrative drawing of the process of Example 5.

As illustrated in FIG. 21, an Au/Ti thin film mask (Au 300 nm/Ti 10 nm) 11 having lines & spaces in the <100> direction, width of which was 1 μm and an interval of which was 1 μm, were formed on a portion of the surface of the phosphorus-doped n-type diamond semiconductor film 13 formed on the {100}-facet diamond single crystal substrate by using photolithography.

The phosphorus-doped n-type diamond semiconductor film which was patterned with an Au/Ti thin film mask illustrated in FIG. 21 was etched by using an inductively coupled plasma etching apparatus. The conditions of the etching gas were $O_2$: 95 sccm, $CF_4$: 2 sccm, RF power: 300 W, bias: 50 W, and pressure: 2 Pa, and the etching depth was 1 μm. In this case, the etching selection ratio of the {100}-facet phosphorus-doped n-type diamond semiconductor film and Au was about 1:8. Next, a thermal aqua regia process ($HNO_3$:$HCl$=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 22, a recessed portion 12 which was a trench having a rectangular cross section and extending in one direction was formed on a surface layer of the {100}-facet phosphorus-doped n-type diamond semiconductor film. The side face of the recessed portion 12 was covered with the {110} facet, the bottom face of the recessed portion was covered with the {100} facet.

Figure 23:
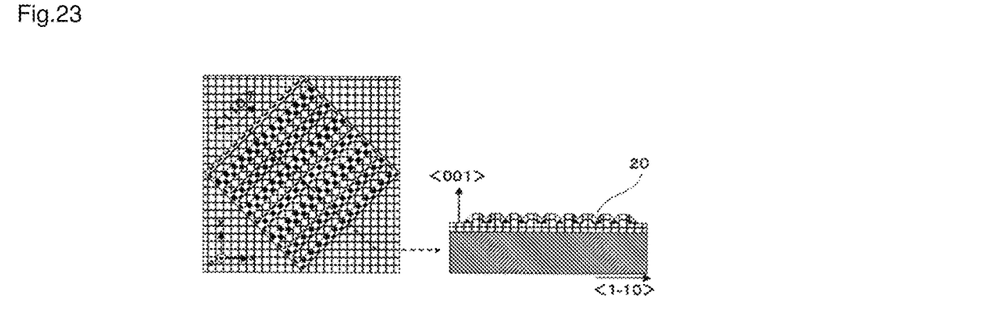
[FIG. 23] Illustrative drawing of the process of Example 5.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: $9.75 \times 10^3$ Pa, microwave power: 750 W, temperature of substrate heater: 800° C., and growing time: 2 hours. Accordingly, the phosphorus-doped diamond area 20 was formed to be buried in the recessed portion 12. At this time, the phosphorus-doped diamond was grown in the <111> direction from the bottom stage (the corner of the {110} facet and the {100} facet) of the recessed portion 12 as the start point.

With respect to the {100}-facet phosphorus-doped n-type diamond semiconductor film including the selectively buried area 20 illustrated in FIG. 23, the phosphorus concentration was measured by using SIMS (Secondary Ion Mass Spectroscopy). As a result, phosphorus atoms were selectively captured only into the area of the rectangular trenches, so that the concentration of phosphorus atoms was $7 \times 10^{19}$ cm$^{-3}$. The concentration of phosphorus in an area deeper than the recessed portion was $2 \times 10^{18}$ cm$^{-3}$.

In order to measure the characteristics of the electric conductivity of the n-type diamond area 20 buried in the rectangular trenches, electrodes of Ti (30 nm)/Pt (30 nm)/Au (100 nm) were vapor-deposited in an interval of 10 μm. Form the current-voltage characteristics between two electrodes, the electric conductivity was clearly obtained. The value of resistivity was about $2 \times 10^3$ Ωcm. In addition, in the case where there was no buried n-type diamond semiconductor area, namely, in the case of the {100}-facet phosphorus-doped n-type diamond semiconductor film single body 13, the value of resistivity was about $10^6$ Ωcm or less. The low-resistance buried highly-concentrated phosphorus-doped diamond area 20 was obtained on a surface layer of the {100}-facet phosphorus-doped n-type diamond semiconductor film.

In addition, contact resistance of the n-type diamond area 20 buried in a rectangular trench was estimated by using linear TLM (Transfer Length Method). In the case where Ti was vapor-deposited, the obtained contact resistance was $1 \times 10^{-2}$ Ωcm$^2$. In addition, in the case where there was no buried n-type diamond semiconductor area, namely, in the case of the {100}-facet phosphorous-doped n-type diamond semiconductor film single body 13, the contact resistance was $10^5$ Ωcm$^2$ or more. Thus, it can be confirmed that the present invention was greatly effective in decreasing the contact resistance of the {100}-facet phosphorus-doped n-type diamond semiconductor film.

Example 6

Figure 24:
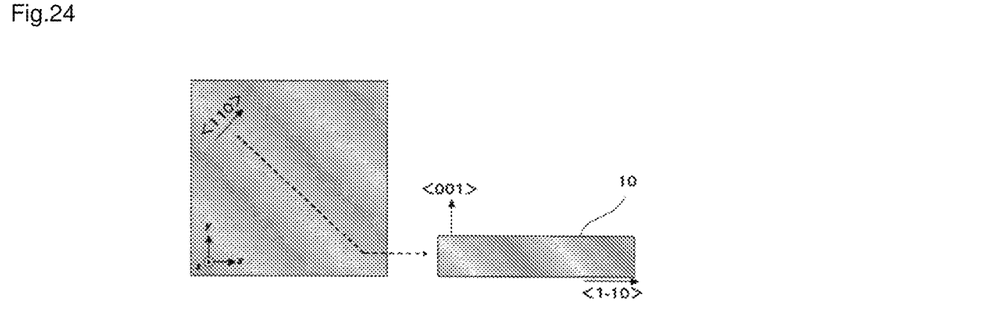
[FIG. 24] Illustrative drawing of the process of Example 6.
Figure 25:
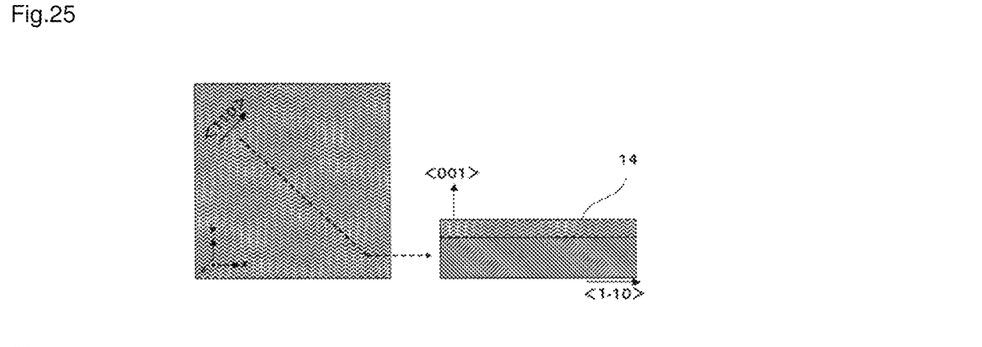
[FIG. 25] Illustrative drawing of the process of Example 6.

As illustrated in FIG. 24, a diamond single crystal substrate 10 having {100} facet as the surface thereof was prepared. The synthesis of the boron-doped diamond was performed by using a microwave plasma CVD apparatus under the conditions of $H_2$: 397 sccm, $CH_4$: 1.2 sccm, $B_2H_6/H_2$ gas=100 ppm: 0.6 sccm, pressure: $3.25 \times 10^3$ Pa, microwave power: 750 W, temperature of substrate heater: 800° C., and growing time: 6 hours. As illustrated in FIG. 25, a boron-doped p-type diamond semiconductor 14 having a film thickness of about 2 μm was formed. From the Hall effect measurement, p-type determination was stably obtained in a temperature range of from the room temperature to about 700° C. From the slope of temperature dependency, the activation energy of boron acceptor was estimated to be 370 meV. Thus, it can be confirmed that the boron-doped p-type diamond semiconductor was formed on the {100}-facet diamond single crystal substrate.

Figure 26:
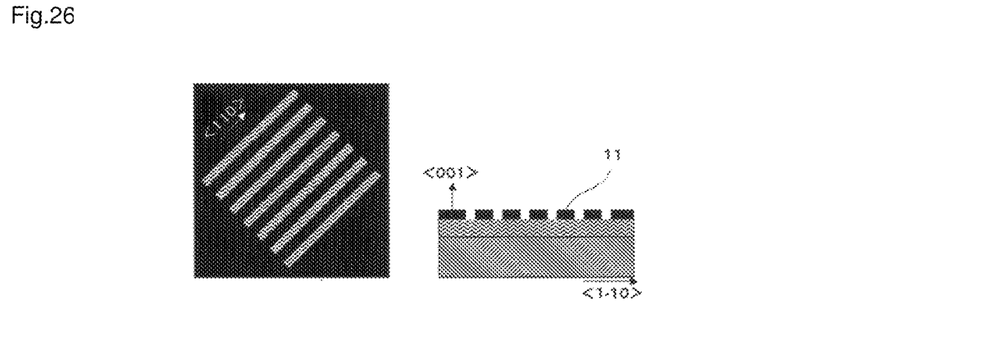
[FIG. 26] Illustrative drawing of the process of Example 6.
Figure 27:
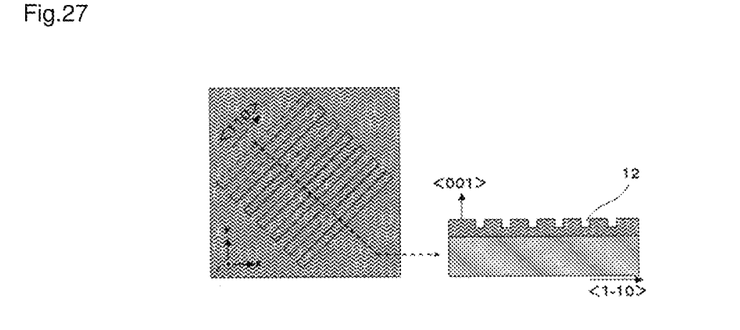
[FIG. 27] Illustrative drawing of the process of Example 6.

As illustrated in FIG. 26, an Au/Ti thin film mask (Au 300 nm/Ti 10 nm) 11 having lines & spaces in the <100> direction, width of which was 1 μm and an interval of which was 1 μm, were formed on a portion of the surface of the boron-doped p-type diamond semiconductor film 14 formed on the {100}-facet diamond single crystal substrate by using photolithography.

The boron-doped p-type diamond semiconductor film which was patterned with an Au/Ti thin film mask was etched by using an inductively coupled plasma etching apparatus. The conditions of the etching gas were $O_2$: 95 sccm, $CF_4$: 2 sccm, RF power: 300 W, bias: 50 W, and pressure: 2 Pa, and the etching depth was 1 μm. In this case, the etching selection ratio of the {100}-facet boron-doped p-type diamond semiconductor film and Au was about 1:8. Next, a thermal aqua regia process ($HNO_3$:HCl=1:3, 80° C.), a sulfuric acid water addition process ($H_2SO_4$:$H_2O_2$:$H_2O$=3:1:1, 120° C.), and a thermal mixed acid process ($HNO_3$:$H_2SO_4$=1:3, 240° C.) were performed, so that the Au/Ti mask was removed. Accordingly, as illustrated in a cross section of FIG. 27, a recessed portion 12 which was sandwiched by rectangular gibbosities and has a rectangular cross section, and was extending in one direction was formed on a surface layer of the {100}-facet boron-doped p-type diamond semiconductor film. The side face of the recessed portion 12 was covered with the {110} facet, and the bottom face of the recessed portion 12 was covered with the {100} facet.

Figure 28:
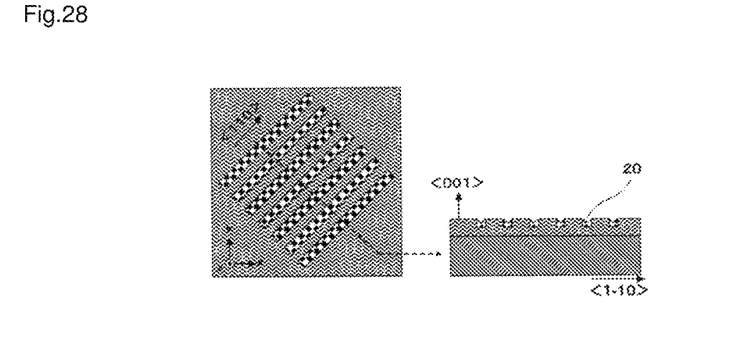
[FIG. 28] Illustrative drawing of the process of Example 6.

The synthesis of the phosphorus-doped diamond was performed by using a microwave plasma CVD apparatus under the conditions of $H_2$: 398 sccm, $CH_4$: 0.2 sccm, $PH_3$: 0.1 sccm, pressure: $9.75 \times 10^3$ Pa, microwave power: 750 W, temperature of substrate heater: 800° C., and growing time: 2 hours. Accordingly, the phosphorus-doped diamond area 20 was formed to be buried in the recessed portion 12. At this time, the phosphorus-doped diamond was grown in the <111> direction from the bottom stage (the corner of the {110} facet and the {100} facet) of the recessed portion 12 as the start point.

With respect to the {100}-facet phosphorus-doped n-type diamond semiconductor film including the selectively buried area 20 illustrated in FIG. 28, the phosphorus concentration was measured by using SIMS (Secondary Ion Mass Spectroscopy). As a result, phosphorus atoms were selectively captured only into the area of the rectangular trenches, so that the concentration of phosphorus atoms was $7 \times 10^{19}$ cm$^{-3}$. The low-resistance buried highly-concentrated phosphorus-doped diamond area 20 was obtained on a surface layer of the {100}-facet boron-doped p-type diamond semiconductor film.

Hereinbefore, preferred embodiments are described, but the present invention is not limited thereto.

For example, the diamond semiconductor substrate according to the present invention also includes a substrate obtained by forming a diamond film on a substrate made of ceramic or the like or on a diamond substrate.

In addition, for example, the facet orientation such as a {100} facet also includes a neighboring off facet.

The diamond semiconductor device of the present invention can be adapted to not only semiconductor devices such as a power semiconductor device and a high frequency semiconductor device, but also various electronic devices such as a UV emitting device, an electron emission source, an X-ray/particle beam sensor, and an X-ray/particle positioning sensor.

The invention claimed is:

1. A diamond semiconductor device having an impurity-doped diamond area buried in a recessed portion selectively formed in a diamond substrate,
   wherein a principal surface of the diamond substrate is a {100} facet, a side face of the recessed portion is a {110} facet, and a bottom face of the recessed portion is a {100} facet,
   wherein the recessed portion is surrounded by the bottom face of the {100} facet and the side face of the {110} facet, respectively,
   wherein the impurity-doped diamond area is composed of a diamond epitaxially grown in a <111> direction from a corner of the side face of the {110} facet and the bottom face of the {100} facet of the recessed portion, with the corner serving as the start point of epitaxial growing, and
   wherein the impurity is phosphorus.

2. The diamond semiconductor device according to claim 1, wherein the diamond substrate is an impurity-doped diamond substrate.

3. The diamond semiconductor device according to claim 1, wherein the diamond substrate is a diamond substrate on which a diamond film is formed.

4. A method for manufacturing a diamond semiconductor device, comprising the steps of:
   selectively forming a recessed portion on a {100}-facet diamond semiconductor substrate, wherein the recessed portion is surrounded by a bottom face of a {100} facet and a side face of a {110} facet, and
   forming an impurity-doped diamond area composed of an impurity-doped diamond semiconductor by epitaxially growing a diamond in a <111> direction from a corner of the side face of the {110} facet and the bottom face of the {100} facet, with the corner serving as the start point of epitaxial growing, while doping with impurities, to thereby bury the recessed portion,
   wherein the impurity is phosphorus.

5. A diamond semiconductor device having an impurity-doped diamond area buried in a recessed portion selectively formed in a diamond substrate,
   wherein a principal surface of the diamond substrate is a {100} facet, a side face of the recessed portion is a {100} facet, and a bottom face of the recessed portion is a {100} facet,
   wherein the bottom face and the side face of the recessed portion are surrounded by the {100} facet and the {100} facet, respectively, and
   wherein the impurity-doped diamond area is composed of a diamond epitaxially grown in a <110> direction from a corner of the side face of the {100} facet and the bottom face of the {100} facet, with the corner serving as the start point of epitaxial growing.

* * * * *